(12) United States Patent
Legendre

(10) Patent No.: US 6,310,516 B1
(45) Date of Patent: Oct. 30, 2001

(54) ATTENUATION COMPENSATION IN AMPLIFICATION FOR A DISTRIBUTION NETWORK

(75) Inventor: Michel Legendre, Vernon (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/593,835

(22) Filed: Jun. 14, 2000

(30) Foreign Application Priority Data

Jun. 15, 1999 (FR) .................................................. 99 07560

(51) Int. Cl.$^7$ ....................................................... H03G 3/20
(52) U.S. Cl. ............................................ 330/129; 330/149
(58) Field of Search ..................................... 330/129, 149

(56) References Cited

U.S. PATENT DOCUMENTS

| | | | |
|---|---|---|---|
| 4,366,446 | * 12/1982 | Henderson et al. | 330/260 |
| 4,600,847 | 7/1986 | Baum | 307/491 |
| 5,623,228 | * 4/1997 | Arbel | 330/110 |
| 5,798,854 | * 8/1998 | Blauvelt et al. | 359/161 |

FOREIGN PATENT DOCUMENTS

0206557A2   12/1986   (EP) .

OTHER PUBLICATIONS

"Empfangsuntersystems im Ku–Band und Ka–Band fur Erdfunkstellen des DFS Kopernikus", by Michael Alberty et al., Oct. 1990, No. 7 pp. 110–118 (XP000234676).

* cited by examiner

*Primary Examiner*—Robert Pascal
*Assistant Examiner*—Henry Choe

(57) ABSTRACT

An amplifier intended for a signal distribution network, comprising filter means for giving a positive slope to the curve (N, $L_{in}$, K) of the amplifier gain as a function of frequency. The filter means produce a curve (N) that satisfies the formula: $L(dB\mu V)=K*(F)^{3/2}$ in which "L" is the level of the output signal, "F" the frequency and "K" a proportionality factor.

6 Claims, 2 Drawing Sheets

ATTENUATION COMPENSATION IN AMPLIFICATION FOR A DISTRIBUTION NETWORK

BACKGROUND OF THE INVENTION

The present invention relates to an amplifier intended for a signal distribution network, for amplifying these signals in a predetermined frequency range, which amplifier comprises means for giving a positive slope to the curve that represents the amplifier gain as a function of frequency.

The invention further relates to a signals distribution network.

An amplifier intended for a signals distribution network according to the above opening paragraph is known from patent application EP-A-0 206 557. According to this document an equalizer corrects the slope in the signal, which slope is due to the attenuation characteristic of the cable as a function of frequency.

SUMMARY OF THE INVENTION

It is an object of the invention to attenuate the intermodulation signals (called "CSO" or "CTB") created by the amplifier, or, which boils down to the same, to enhance the output power which the amplifier can deliver for a given distortion.

For this purpose, said means give the curve a slope which, compared with the slope called linear slope obtained in the case where the slope regularly increases with frequency, is smaller than the linear slope in the lower region of the frequency range, and larger in the upper region of this range.

As indicated in said document, it is known that cables bring in an attenuation that increases with frequency and it was only natural to look for a compensation of this attenuation, which led to the choice of a larger slope than the linear slope in the lower region of the frequency range, and after this a smaller slope in the upper region of this range; this form of curve exactly compensates the attenuation of the cable. The invention is based on the finding that in fact, for obtaining the best results, a different slope is to be chosen from that which compensates the attenuation of the cable. Advantageously, the curve presenting the gain of the amplifier plotted against frequency, produced by said means, satisfies the formula: $L(dB\mu V)=K*(F)^{3/2}$ in which "L" is the signal level, "F" is the frequency and "K" is a proportionality factor.

A signals distribution network advantageously comprises at least an amplifier that includes means as defined above.

BRIEF DESCRIPTION OF THE DRAWINGS

These aspects of the invention as well as more detailed other aspects will become clearer thanks to the following description of an embodiment, which forms a non-limitative example, in which.

DETAILED DESCRIPTION

Figure 1:
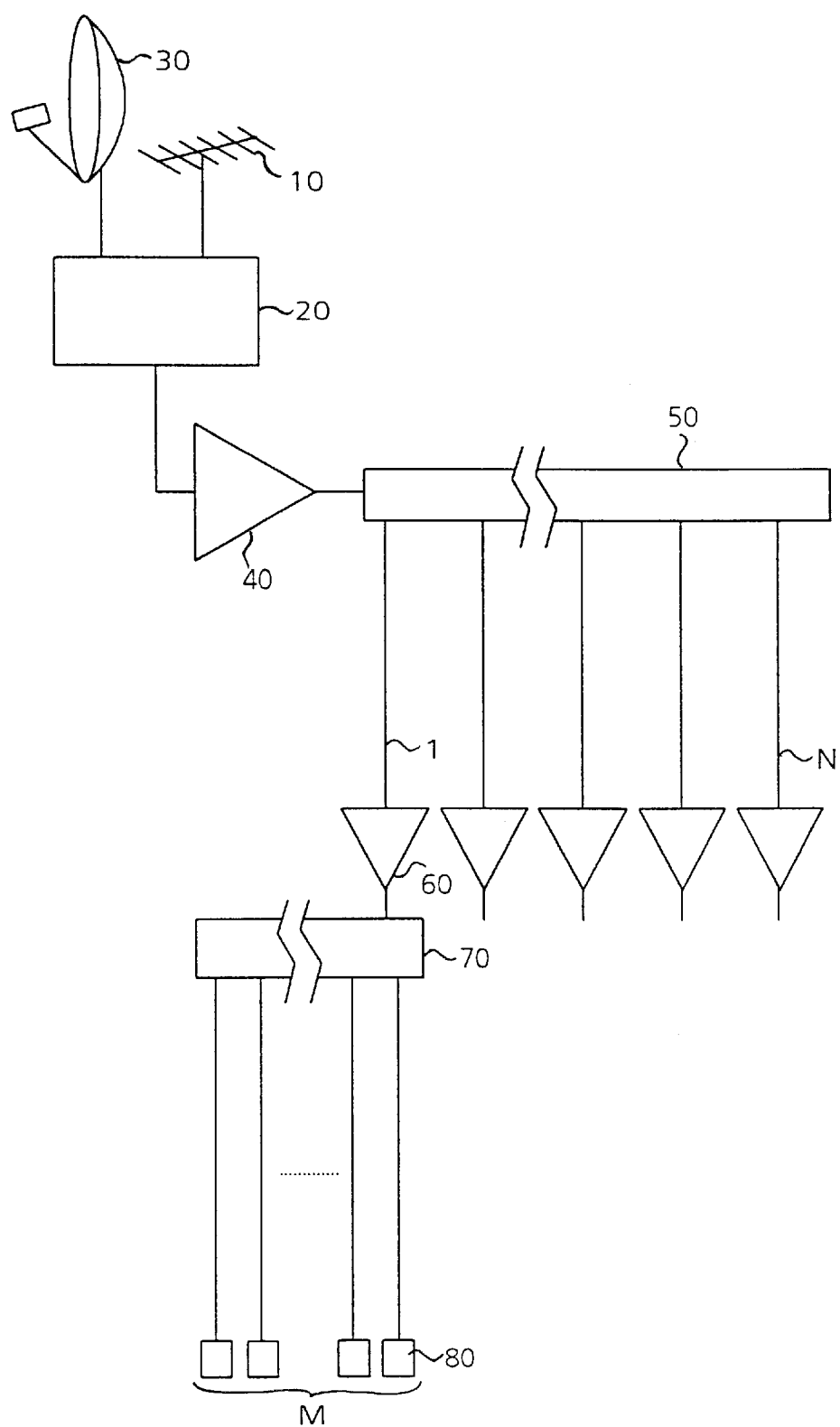
FIG. 1 diagrammatically represents a signal distribution network, here a television distribution network.

In the network of FIG. 1, an antenna system comprises a dish antenna 30 for satellite reception, in the focus of which antenna is located a conventional receiving converter, and an antenna called "terrestrial" antenna 10. The signals coming from these two sources are mixed in a way that does not form part of the invention, in a module 20 which applies signals in a frequency range to an amplifier 40. A distributor 50 delivers to each of the N cables 1 to N all the mixed signals coming from the module 20. In their turn these cables deliver signals which are amplified by amplifiers one of which being referenced 60, to distributors 70, of which a single one is represented so as not to obscure the drawing Figure. A distributor 70 delivers the signals to each of the M terminals 80 which each form a connection to a user. The number of terminals that can be installed while guaranteeing a given signal quality on each terminal is a measure of the effectiveness of the network.

This network is described by way of example; an amplifier according to the invention may be situated in any application called "CATV" or "MATV" in which connecting cables are used, for example, also in the output stage of an optical link.

The amplifier 40 and/or the amplifiers 60 comprise means, for example filters, for giving a positive slope to the curve that represents the gain or the output level of the amplifier as a function of frequency.

Figure 2:
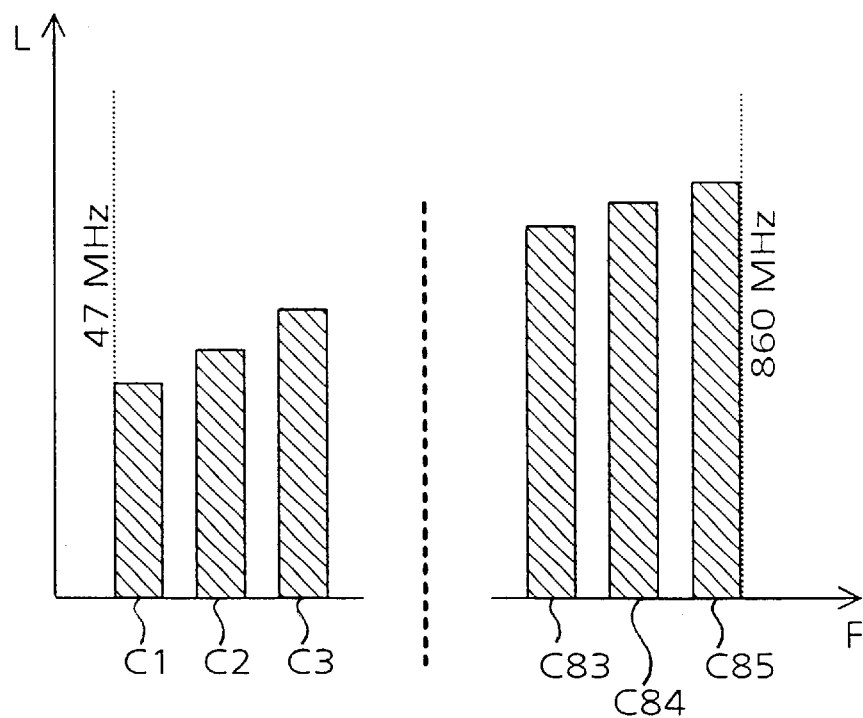
FIG. 2 is a level/frequency diagram illustrating the amplitude of television channels which are spread between the extreme frequencies of 47 MHz and 860 MHz.

In FIG. 2, channels numbered C1 to C85 are represented in a frequency range running from 47 to 860 MHz. The amplitude of these channels augments when going from the lowest frequencies to the highest frequencies.

Figure 3:
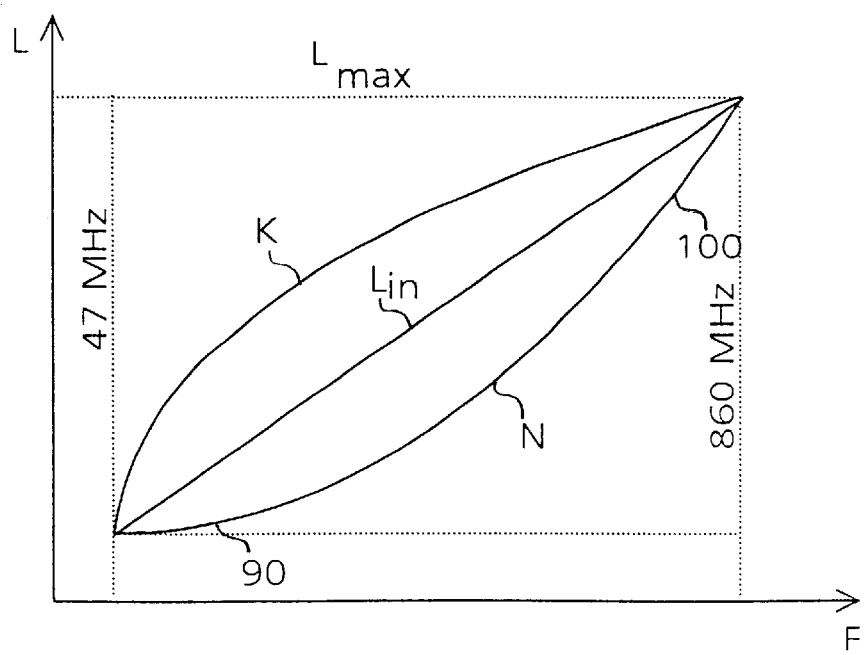
FIG. 3 illustrates various types of signal level curves produced by an amplifier as a function of frequency.

FIG. 3 illustrates with more precision the form of various types of curves of levels of signals produced by an amplifier, plotted against frequency. A curve represents the positions of the highest central points of the channels of FIG. 2. To facilitate the comparisons, all the curves end on the side of the highest frequencies at the same maximum level $L_{max}$.

The curve $L_i$ is the slope called linear slope obtained in the case where there is a regular increase with frequency.

The curve K is the known curve that corresponds to the exact compensation of the attenuation characteristic of the cable as a function of frequency. Such a curve in theory satisfies the function $L(dB\mu V)=K*\sqrt{F}$.

The curve N is the curve that may be obtained according to the invention. Its slope, compared with that of curve $L_{in}$, is smaller than 90 in the lower frequency range and, thereafter, larger in the upper part 100 of this range.

Preferably, the curve N of FIG. 3 represents the function: $L(dB\mu V)=K*(F)^{3/2}$, in which "L" is the level of the delivered signal (in $dB\mu V$), "F" is the frequency and "K" is a proportionality factor.

Such a curve may be obtained by any known means, for example, by means of T-bridged filters, or by a device called "equalizer" such as that defined in cited document.

An amplifier according to the invention permits, for example in the case of the measure called "60 PALVHF"+ 64-QAM signals up to 860 MHz, to supply power to a number of terminals that is nearly 15% higher than those obtained in the prior art, which means a 15% saving on the cost of the system.

It must be evident that the use of the verb "to comprise" and its conjugations does not exclude the presence of elements or steps other than those stated in a claim.

What is claimed is:

1. A signals distribution network for amplifying signals in a predetermined frequency range, comprising:

an amplifier; and means for giving a positive slope to a curve that represents the amplifier gain of the amplifier as a function of frequency, characterized in that said means give the curve a slope which, compared with a linear slope wherein the slope regularly increases with frequency, is smaller than the linear slope in a lower region of the frequency range, and larger in an upper region of the frequency range.

2. An amplifier intended for a signals distribution network as claimed in claim 1, characterized in that the curve representing the amplifier gain plotted against frequency, produced by said means satisfies the formula: $L(dB\mu V)=K*(F)^{3/2}$, in which "L" is the signal level, "F" the frequency and "K" a proportionality factor.

3. The signals distribution network of claim 1, further including a plurality of said amplifiers and a corresponding plurality of said means.

4. The signals distribution network of claim 2, further including a plurality of said amplifiers and a corresponding plurality of said means.

5. A method for amplifying signals in a predetermined frequency range intended for a signals distribution network, comprising:

amplifying signals;

compensating for amplifier gain as a function of frequency during the amplifying step, by giving a positive slope to a curve that represents the amplifier gain as a function of frequency; and giving said curve a slope which, compared to a linear slope in which the slope regularly increases with frequency, is smaller than the linear slope in a lower region of the frequency range, and larger in an upper region of the frequency range.

6. The method of claim 5, in which said compensation is performed such that the curve representing the amplifier gain plotted against frequency satisfies the formula: $L(dB\mu V)=K*(F)^{3/2}$, in which "L" is the signal level, "F" the frequency, and "K" a proportionality factor.

* * * * *